(12) United States Patent
Hsu et al.

(10) Patent No.: US 10,176,356 B2
(45) Date of Patent: Jan. 8, 2019

(54) FINGERPRINT IDENTIFICATION MODULE AND MANUFACTURING METHOD THEREOF

(71) Applicant: Primax Electronics Ltd., Taipei (TW)

(72) Inventors: Mao-Hsiu Hsu, Taipei (TW); Li-Pin Wang, Taipei (TW); Hong-Kai Huang, Taipei (TW); Chih-Hao Hsu, Taipei (TW)

(73) Assignee: PRIMAX ELECTRONICS LTD., Taipei (TW)

(*) Notice: Subject to any disclaimer, the term of this patent is extended or adjusted under 35 U.S.C. 154(b) by 93 days.

(21) Appl. No.: 15/400,174

(22) Filed: Jan. 6, 2017

(65) Prior Publication Data
US 2018/0129851 A1 May 10, 2018

(30) Foreign Application Priority Data
Nov. 4, 2016 (TW) ............... 105135992 A

(51) Int. Cl.
| | |
|---|---|
| *G06K 9/20* | (2006.01) |
| *G06K 9/00* | (2006.01) |
| *B05D 3/02* | (2006.01) |
| *B05D 3/06* | (2006.01) |
| *B05D 3/12* | (2006.01) |
| *B05D 5/00* | (2006.01) |

(52) U.S. Cl.
CPC ....... *G06K 9/00013* (2013.01); *B05D 3/0254* (2013.01); *B05D 3/067* (2013.01); *B05D 3/12* (2013.01); *B05D 5/00* (2013.01); *G06K 9/00087* (2013.01); *H01L 2224/48091* (2013.01); *H01L 2224/73265* (2013.01)

(58) Field of Classification Search
CPC .................... G06K 9/00006–9/0012
See application file for complete search history.

(56) References Cited

U.S. PATENT DOCUMENTS

| | | | | |
|---|---|---|---|---|
| 9,824,257 | B2* | 11/2017 | Chou | G06K 9/00053 |
| 2002/0044765 | A1* | 4/2002 | Elberbaum | G11B 17/10 386/210 |
| 2016/0011415 | A1* | 1/2016 | Takada | G02B 27/0018 348/148 |
| 2016/0283776 | A1* | 9/2016 | Chang | G06K 9/0002 |
| 2016/0351465 | A1* | 12/2016 | Chuang | G06F 3/0416 |
| 2017/0372119 | A1* | 12/2017 | Lee | G06K 9/0002 |

* cited by examiner

*Primary Examiner* — Brian Werner
(74) *Attorney, Agent, or Firm* — Muncy, Geissler, Olds & Lowe, P.C.

(57) ABSTRACT

A method for manufacturing a fingerprint identification module is provided. In a step (a), a fingerprint sensor comprising a substrate, a sensing chip and a package layer is provided. The sensing chip is disposed on the substrate. The sensing chip is encapsulated by the package layer. In a step (b), an ink material is coated on the package layer, so that a color ink layer is formed on the package layer. In a step (c), a stamping tool is used to stamp the color ink layer, so that a top surface of the color ink layer becomes a first high gloss surface. In a step (d), the color ink layer to be heated through baking or irradiated with UV light, so that the color ink layer is hardened.

10 Claims, 9 Drawing Sheets

FINGERPRINT IDENTIFICATION MODULE AND MANUFACTURING METHOD THEREOF

FIELD OF THE INVENTION

The present invention relates to a fingerprint identification module and a manufacturing method, and more particularly to a fingerprint identification module with a high gloss surface and a manufacturing method.

BACKGROUND OF THE INVENTION

With increasing development of science and technology, a variety of electronic devices have built-in fingerprint identification modules. Moreover, the electronic devices are unlocked through the fingerprint identification modules. Generally, a fingerprint identification module comprises a contact region and a fingerprint sensor. When the contact region is pressed by a user's finger, the fingerprint of the user's finger on the contact region is detected by the fingerprint sensor.

Conventionally, a paint-spraying process is performed to spray paint on the contact region of the fingerprint identification module. However, it is difficult to well control the smoothness and thickness of the contact region by the paint-spraying process. If the smoothness of the contact region is insufficient, the surface of the contact region is rough and not aesthetically pleasing. Moreover, if the thickness of the sprayed paint of the contact region is too large, the accuracy of the fingerprint detection is impaired. Moreover, the paint-spraying process cannot form marks on the contact region. In other words, the conventional fingerprint identification module needs to be further improved.

SUMMARY OF THE INVENTION

The present invention provides a fingerprint identification module and a manufacturing method thereof. By performing a stamping process, the fingerprint identification module has a flat high gloss surface. Consequently, the identification accuracy of the fingerprint identification module is enhanced.

In accordance with an aspect of the present invention, there is provided a method for manufacturing a fingerprint identification module. In a step (a), a fingerprint sensor comprising a substrate, a sensing chip and a package layer is provided. The sensing chip is disposed on the substrate. The sensing chip is encapsulated by the package layer. In a step (b), an ink material is coated on the package layer, so that a color ink layer is formed on the package layer. In a step (c), a stamping tool is used to stamp the color ink layer, so that a top surface of the color ink layer becomes a first high gloss surface. In a step (d), the color ink layer to be heated through baking or irradiated with UV light, so that the color ink layer is hardened.

After the step (d), the method further includes the following steps. In a step (e), a UV-curable resin material is coated on the color ink layer, so that a UV-curable resin layer is formed on the color ink layer. In a step (f), the stamping tool is used to stamp the UV-curable resin layer, so that a top surface of the UV-curable resin layer becomes a second high gloss surface. In a step (g), the UV-curable resin layer is irradiated with UV light, so that the UV-curable resin layer is hardened.

In an embodiment, the method further includes a step (d') of forming an anti-fingerprint coating on the first high gloss surface of the color ink layer after the step (d).

In an embodiment, the method further includes a step (g') of forming an anti-fingerprint coating on the second high gloss surface of the UV-curable resin layer after the step (g).

In an embodiment, a thickness of the fingerprint sensor is in a range between 10 and 30 micrometers, a thickness of the UV-curable resin layer is in a range between 10 and 15 micrometers, and a thickness of the anti-fingerprint coating is in a range between 1 and 3 micrometers.

In an embodiment, the stamping tool used in the step (c) has a stamping surface. The stamping surface is a smooth surface, an embossed surface, or a composite surface with a combination of the smooth surface and the embossed surface. While the top surface of the color ink layer is stamped by the stamping tool, the top surface of the color ink layer is shaped by the stamping surface of the stamping tool.

In an embodiment, the stamping tool used in the step (f) has a stamping surface. The stamping surface is a smooth surface, an embossed surface, or a composite surface with a combination of the smooth surface and the embossed surface. While the top surface of the UV-curable resin layer is stamped by the stamping tool, the top surface of the UV-curable resin layer is shaped by the stamping surface of the stamping tool.

In an embodiment, the ink material is a light-cured ink material, a heat-cured ink material, or a mixed ink material with the light-cured ink material and the heat-cured ink material.

In an embodiment, the stamping tool is a platen roller or a platen plate.

In accordance with another aspect of the present invention, there is provided a fingerprint identification module. The fingerprint identification module includes a fingerprint sensor and a color ink layer. The fingerprint sensor includes a substrate, a sensing chip and a package layer. The sensing chip is disposed on the substrate. The sensing chip is encapsulated by the package layer. The color ink layer is formed on the package layer. After the color ink layer is stamped, the color ink layer has a first high gloss surface.

In an embodiment, the fingerprint identification module further includes an anti-fingerprint coating. The anti-fingerprint coating is formed on the first high gloss surface of the color ink layer.

In an embodiment, the fingerprint identification module further includes a UV-curable resin layer, and the UV-curable resin layer is formed on the color ink layer. After the UV-curable resin layer is stamped, the UV-curable resin layer has a second high gloss surface.

In an embodiment, the fingerprint identification module further includes an anti-fingerprint coating. The anti-fingerprint coating is formed on the second high gloss surface of the UV-curable resin layer.

In an embodiment, a thickness of the fingerprint sensor is in a range between 10 and 30 micrometers, a thickness of the UV-curable resin layer is in a range between 10 and 15 micrometers, and a thickness of the anti-fingerprint coating is in a range between 1 and 3 micrometers.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 2A:
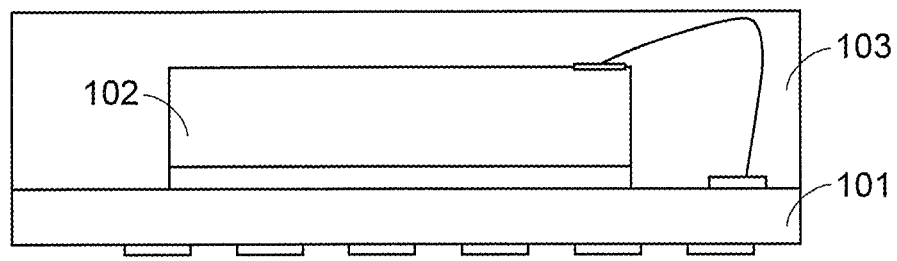
FIG. 2A is a schematic cross-sectional view illustrating a fingerprint sensor of a fingerprint identification module according to an embodiment of the present invention.

FIG. 2A is a schematic cross-sectional view illustrating a fingerprint sensor of a fingerprint identification module according to an embodiment of the present invention. As shown in FIG. 2A, the fingerprint sensor 10 comprises a substrate 101, a sensing chip 102 and a package layer 103. The sensing chip 102 is attached on the substrate 101 though a gluing material. The sensing chip 102 is electrically connected with the substrate 101 through a wire. The package layer 103 is also formed on the substrate 101. Moreover, the sensing chip 102 formed on the substrate 101 is encapsulated by the package layer 103. Preferably but not exclusively, the package layer 103 is made of an epoxy molding compound (EMC) and produced by an etching process.

Figure 1:
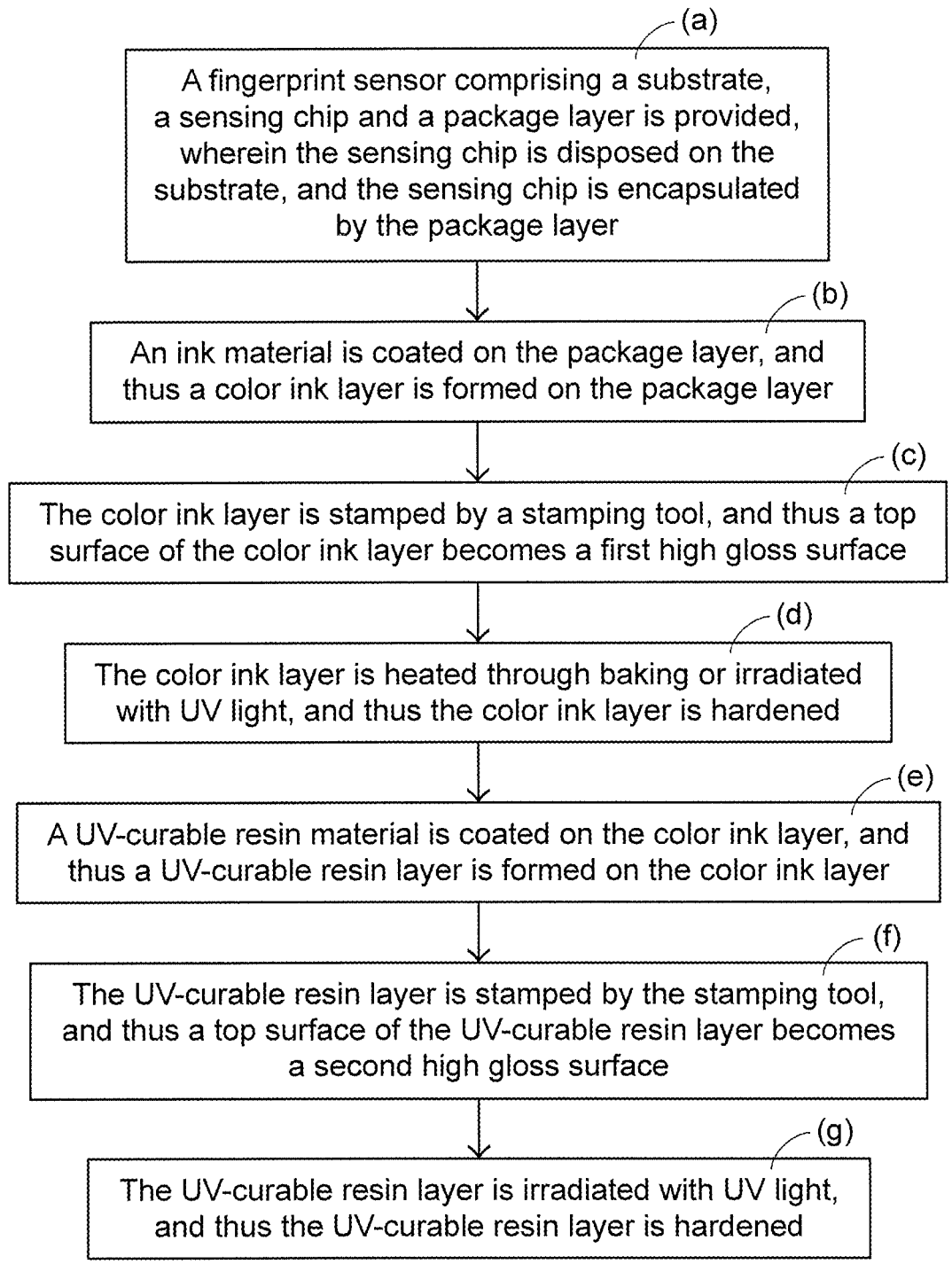
FIG. 1 is a flowchart illustrating a method of manufacturing a fingerprint identification module according to an embodiment of the present invention.

FIG. 1 is a flowchart illustrating a method of manufacturing a fingerprint identification module according to an embodiment of the present invention. Please refer to FIG. 1 and FIGS. 2A-2E.

Firstly, in a step (a), a fingerprint sensor 10 is provided. The fingerprint sensor 10 comprises a substrate 101, a sensing chip 102 and a package layer 103. The sensing chip 102 is disposed on the substrate 101. The sensing chip 102 is encapsulated by the package layer 103.

Figure 2B:
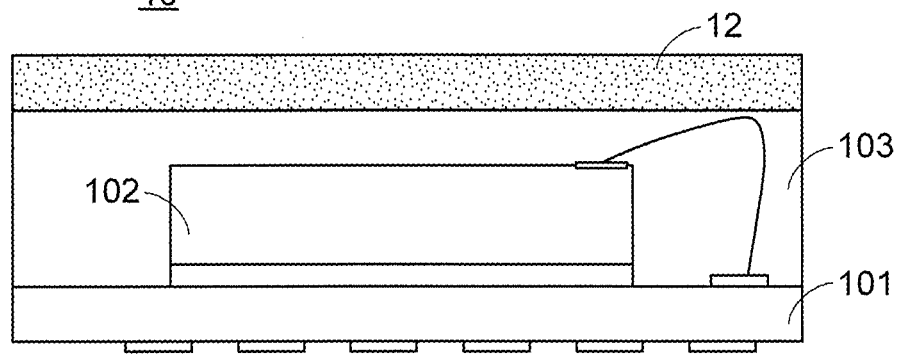
FIG. 2B is a schematic cross-sectional view illustrating a color ink layer coated on the fingerprint sensor of the fingerprint identification module according to the embodiment of the present invention.

After the step (a), a step (b) is performed. Please refer to FIG. 1 and FIG. 2B. FIG. 2B is a schematic cross-sectional view illustrating a color ink layer coated on the fingerprint sensor of the fingerprint identification module according to the embodiment of the present invention. In the step (b), an ink material is coated on the package layer 103, so that a color ink layer 12 is formed on the package layer 103. The constituents of the color ink layer 12 contain color powder or color paste. Consequently, the fingerprint sensor 10 is sheltered by the color of the color ink layer 12. Since the fingerprint sensor 10 is not exposed, the fingerprint sensor 10 cannot be directly viewed by the user.

Figure 2C:
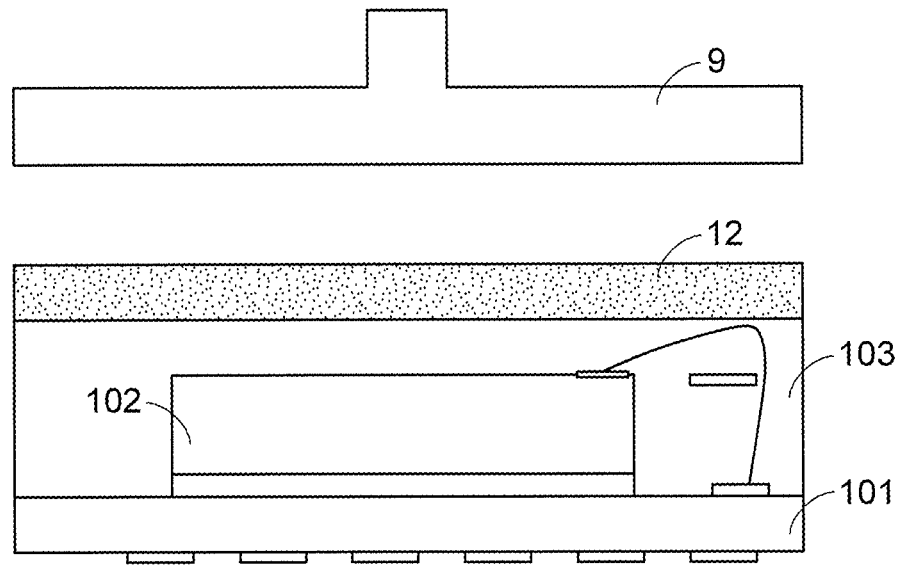
FIG. 2C is a schematic cross-sectional view illustrating the fingerprint identification module of the present invention before the color ink layer is stamped by a stamping tool.
Figure 2D:
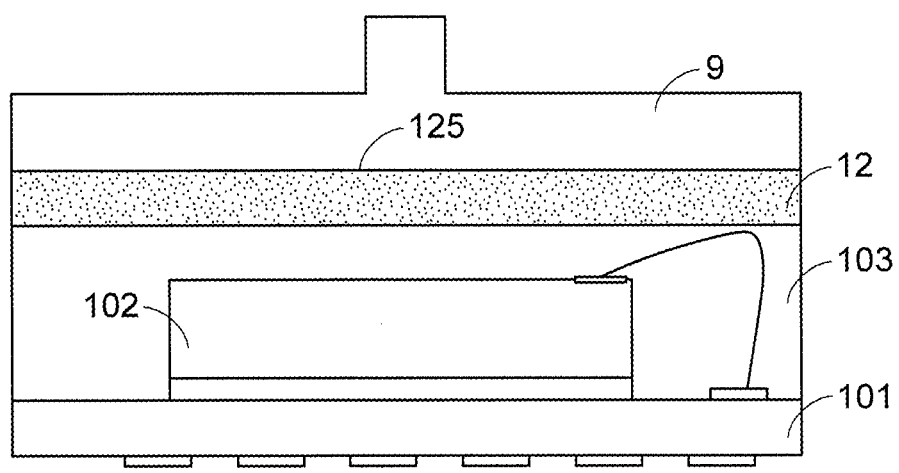
FIG. 2D is a schematic cross-sectional view illustrating the fingerprint identification module of the present invention while the color ink layer is being stamped by the stamping tool.

After the step (b), a step (c) is performed. Please refer to FIG. 1, FIG. 2C and FIG. 2D. FIG. 2C is a schematic cross-sectional view illustrating the fingerprint identification module of the present invention before the color ink layer is stamped by a stamping tool. FIG. 2D is a schematic cross-sectional view illustrating the fingerprint identification module of the present invention while the color ink layer is being stamped by the stamping tool. In a step (c), the color ink layer 12 is stamped by a stamping tool 9. The stamping tool 9 is a stamping device for contacting and pressing an object. For example, the stamping tool 9 is a platen roller or a platen plate. After the stamping step, a top surface of the color ink layer 12 becomes a first high gloss surface 125. The high gloss surface is a smooth surface with high fineness and glossy mirror appearance.

Figure 2E:
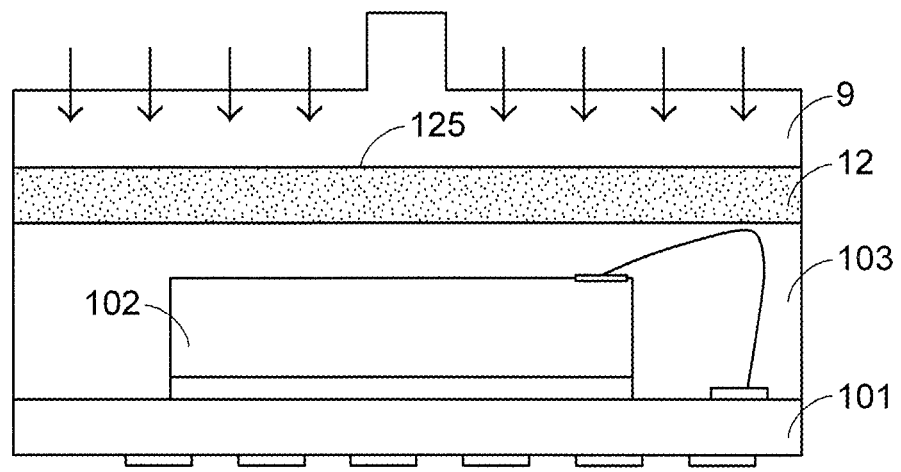
FIG. 2E is a schematic cross-sectional view illustrating the fingerprint identification module of the present invention while the color ink layer is heated through baking or irradiated with UV light.

After the step (c), a step (d) is performed. Please refer to FIG. 1 and FIG. 2E. FIG. 2E is a schematic cross-sectional view illustrating the fingerprint identification module of the present invention while the color ink layer is heated through baking or irradiated with UV light. In the step (d), the color ink layer 12 is heated through baking or irradiated with UV light. Since the color ink layer 12 is hardened, the overall structural strength is increased. After the color ink layer 12 is hardened and solidified, the color ink layer 12 is not detached easily. The ink material of the color ink layer 12 is a light-cured ink material, a heat-cured ink material, or a mixed ink material with the light-cured ink material and the heat-cured ink material. In case that the ink material is the light-cured ink material, the color ink layer 12 is hardened after the color ink layer 12 is irradiated by UV light. In case that the ink material is the heat-cured ink material, the color ink layer 12 is hardened after the color ink layer 12 is heated through baking.

Figure 2F:
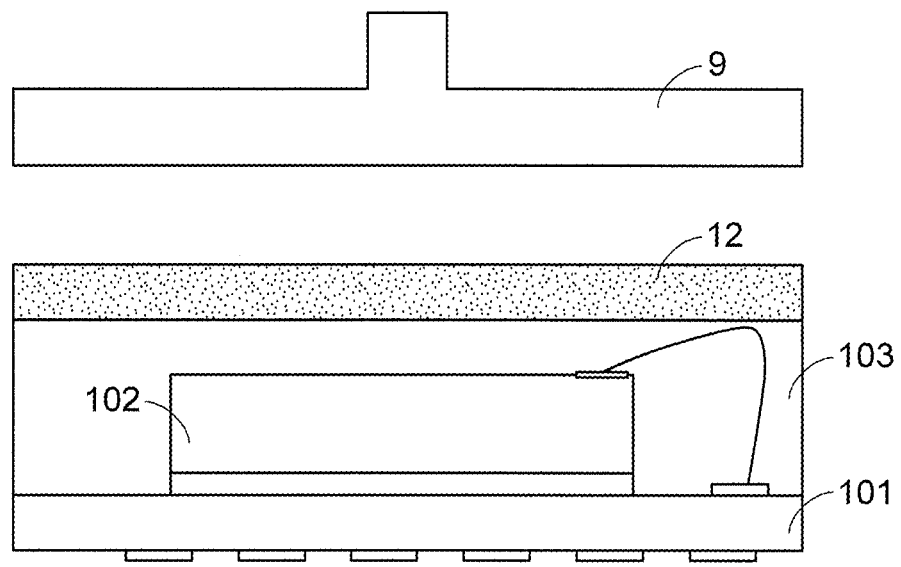
FIG. 2F is a schematic cross-sectional view illustrating the fingerprint identification module of the present invention while the stamping tool is separated from the color ink layer.

After the step (d), the stamping tool 9 is separated from the color ink layer 12 (see FIG. 2F). Meanwhile, the first high gloss surface 125 is formed on the color ink layer 12 of the fingerprint identification module 1. Moreover, after the stamping process, the thickness of the color ink layer 12 is decreased. Consequently, the identification sensitivity is enhanced while the fingerprint identification module 1 performs fingerprint identification.

In another embodiment, the manufacturing method further comprises a step (d') after the step (d). In the step (d'), an anti-fingerprint coating (not shown) is formed on the first high gloss surface 125 of the color ink layer 12. Consequently, no fingerprint contamination is retained on the first high gloss surface 125 of the color ink layer 12.

Figure 3A:
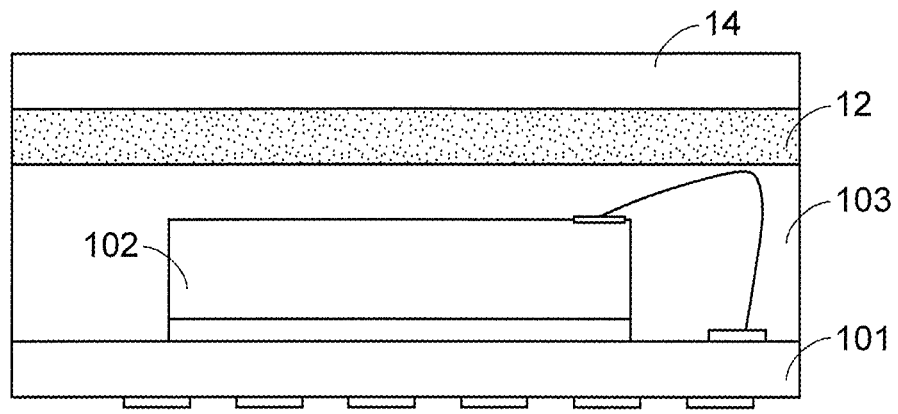
FIG. 3A is a schematic cross-sectional view illustrating the fingerprint identification module of the present invention after a UV-curable resin layer is formed on the color ink layer.

FIG. 3A is a schematic cross-sectional view illustrating the fingerprint identification module of the present invention after a UV-curable resin layer is formed on the color ink layer. After the color ink layer 12 of the fingerprint identification module 1 is stamped, a protective layer is formed on the color ink layer 12 in order to protect the color ink layer 12. The protective layer can absorb a portion of the external force, and thus the color ink layer 12 is not easily damaged.

After the step (d), a step (e) is performed. In the step (e), a UV-curable resin material is coated on the color ink layer 12, and thus a UV-curable resin layer 14 is formed on the color ink layer 12. The UV-curable resin layer 14 is a transparent coating film. The UV-curable resin material is a photosensitive resin material. After the UV-curable resin material is irradiated with UV light, the UV-curable resin material undergoes physical and chemical changes in a short time. Consequently, the UV-curable resin material is cross-linked as low molecular polymer, which is composed of monomer and oligomer.

Figure 3B:
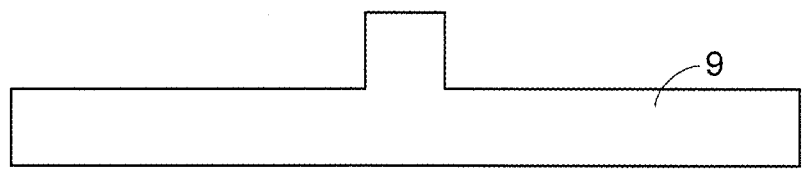
FIG. 3B is a schematic cross-sectional view illustrating the fingerprint identification module of the present invention before the UV-curable resin layer is stamped by the stamping tool.
Figure 3B:
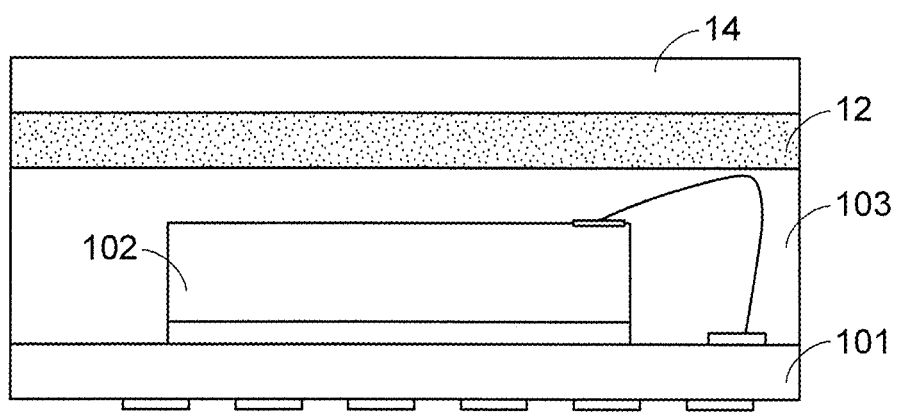
Figure 3C:
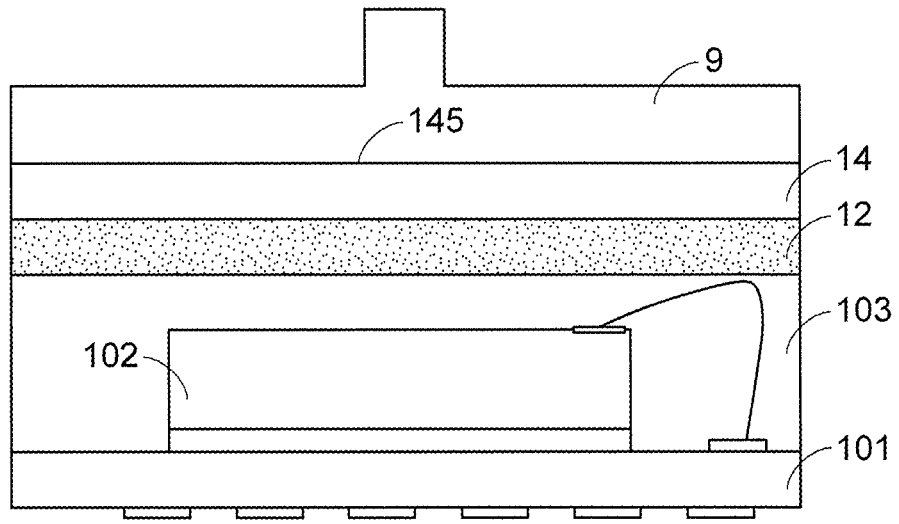
FIG. 3C is a schematic cross-sectional view illustrating the fingerprint identification module of the present invention while the UV-curable resin layer is being stamped by the stamping tool.

After the step (e), a step (f) is performed. Please refer to FIG. 1, FIG. 3B and FIG. 3C. FIG. 3B is a schematic cross-sectional view illustrating the fingerprint identification module of the present invention before the UV-curable resin layer is stamped by the stamping tool. FIG. 3C is a schematic cross-sectional view illustrating the fingerprint identification module of the present invention while the UV-curable resin layer is being stamped by the stamping tool. In a step (f), the UV-curable resin layer 14 is stamped by the stamping tool 9. Consequently, as shown in FIG. 3C, a top surface of the UV-curable resin layer 14 becomes a second high gloss surface 145.

Figure 3D:
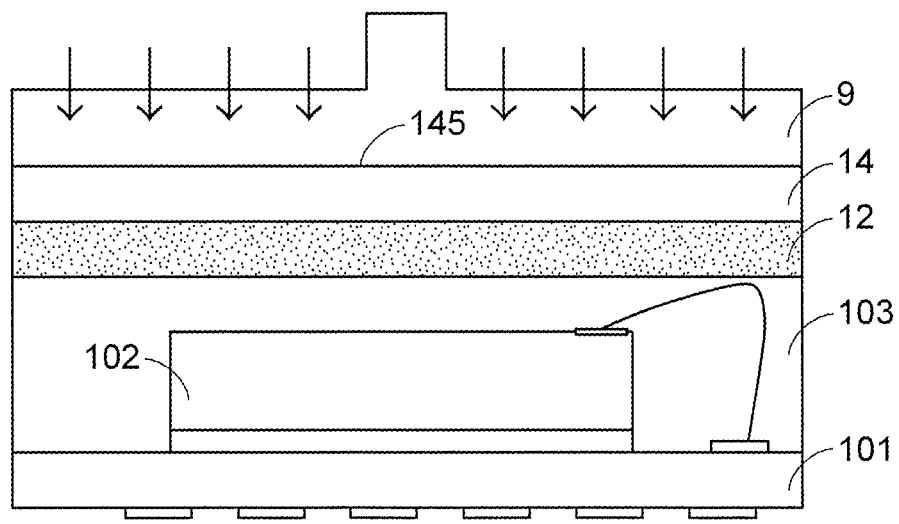
FIG. 3D is a schematic cross-sectional view illustrating the fingerprint identification module of the present invention while the UV-curable resin layer is heated through baking or irradiated with UV light.
Figure 3E:
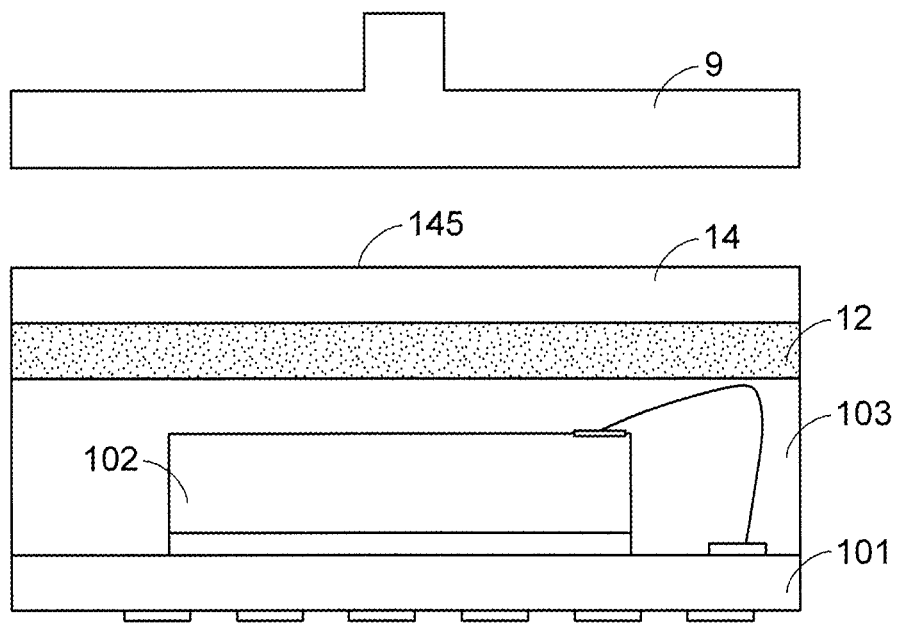
FIG. 3E is a schematic cross-sectional view illustrating the fingerprint identification module of the present invention while the stamping tool is separated from the UV-curable resin layer.

After the step (f), a step (g) is performed. Please refer to FIG. 1, FIG. 3D. FIG. 3D is a schematic cross-sectional view illustrating the fingerprint identification module of the present invention while the UV-curable resin layer is heated through baking or irradiated with UV light. In the step (g), the UV-curable resin layer 14 is irradiated with UV light. Consequently, the UV-curable resin layer 14 is hardened. Meanwhile, the UV-curable resin layer 14 is the outermost layer of the fingerprint identification module 1. The UV-curable resin layer 14 is a transparent protective layer with high hardness. After the step (g), the stamping tool 9 is separated from the UV-curable resin layer 14 (see FIG. 3E). Since the outermost layer of the fingerprint identification module 1 has the high gloss surface, the fingerprint identification module 1 is aesthetically pleasing and has enhanced identification accuracy.

Figure 3F:
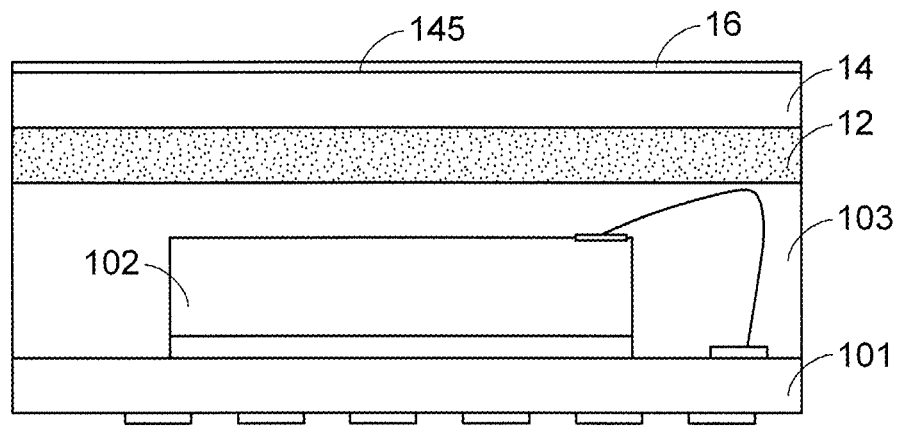
FIG. 3F is a schematic cross-sectional view illustrating the fingerprint identification module of the present invention after an anti-fingerprint coating is formed on the UV-curable resin layer.

Optionally, the manufacturing method further comprises a step (g') after the step (g). In the step (g'), an anti-fingerprint coating 16 is formed on the second high gloss surface 145 of the UV-curable resin layer 14 (see FIG. 3F). Consequently, no fingerprint contamination is retained on the second high gloss surface 145 of the UV-curable resin layer 14.

After the above steps are completed, the fingerprint identification module 1 is manufactured. The thickness of the fingerprint sensor 10 is in the range between 10 and 30 micrometers, the thickness of the UV-curable resin layer 14 is in the range between 10 and 15 micrometers, and the thickness of the anti-fingerprint coating 16 is in the range between 1 and 3 micrometers. The thicknesses of the corresponding structures are presented herein for purpose of illustration and description only.

The stamping tool 9 has a stamping surface. The stamping surface is a smooth surface, an embossed surface, or a composite surface with the combination of the smooth surface and the embossed surface. In case that the stamping surface is the smooth surface, the stamped color ink layer 12 or the stamped UV-curable resin layer 14 has the smooth surface. In case that the stamping surface is the embossed surface, the stamped color ink layer 12 or the stamped UV-curable resin layer 14 has the embossed surface.

Figure 4A:
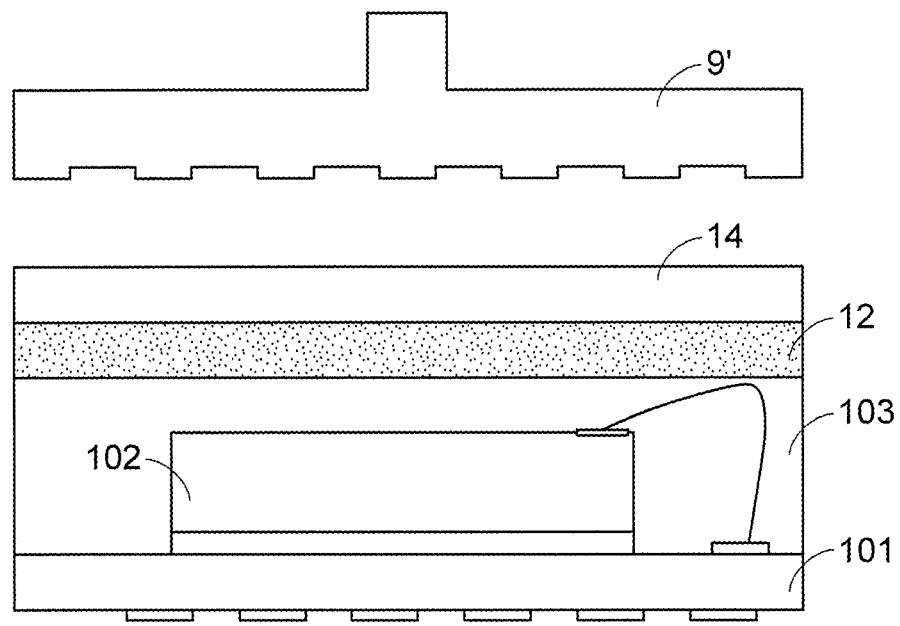
FIG. 4A is a schematic cross-sectional view illustrating the fingerprint identification module of the present invention after the UV-curable resin layer is formed on the color ink layer.
Figure 4B:
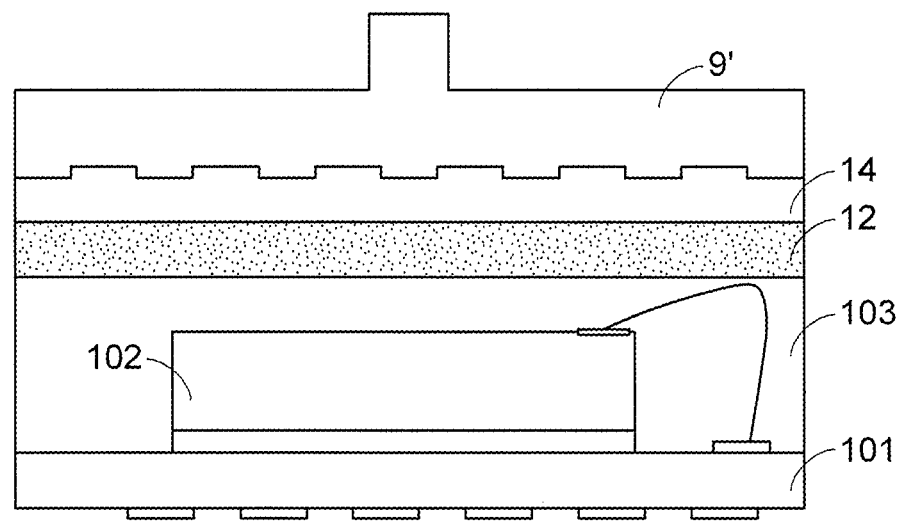
FIG. 4B is a schematic cross-sectional view illustrating the fingerprint identification module of the present invention while the UV-curable resin layer is being stamped by a stamping tool with an embossed surface.
Figure 4C:
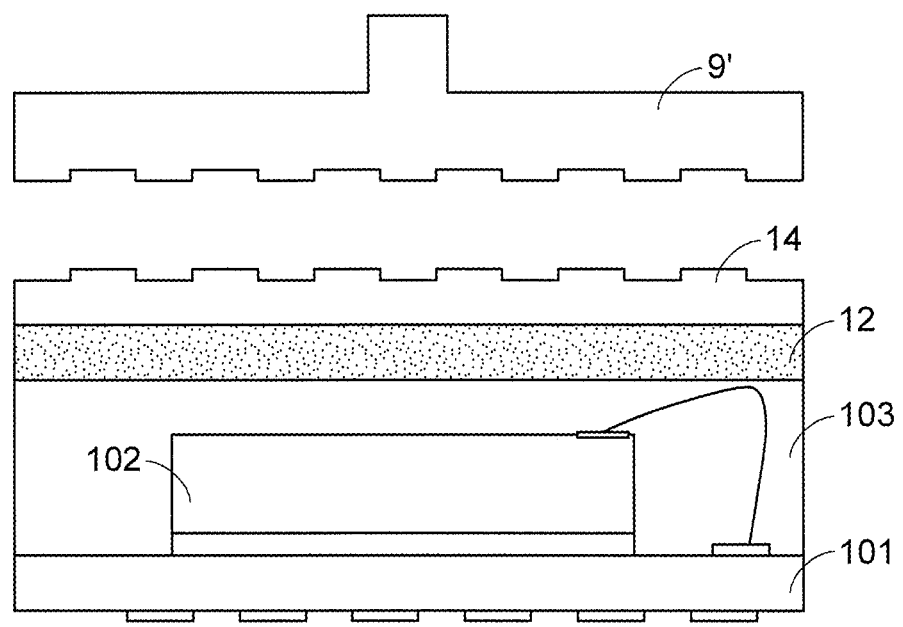
FIG. 4C is a schematic cross-sectional view illustrating the fingerprint identification module of the present invention while the stamping tool with the embossed surface is separated from the UV-curable resin layer.

Please refer to FIGS. 4A, 4B and 4C. FIG. 4A is a schematic cross-sectional view illustrating the fingerprint identification module of the present invention after the UV-curable resin layer is formed on the color ink layer. FIG. 4B is a schematic cross-sectional view illustrating the fingerprint identification module of the present invention while the UV-curable resin layer is being stamped by a stamping tool with an embossed surface. FIG. 4C is a schematic cross-sectional view illustrating the fingerprint identification module of the present invention while the stamping tool with the embossed surface is separated from the UV-curable resin layer. Since the stamping tool 9' has the embossed surface, the stamped color ink layer 12 or the stamped UV-curable resin layer 14 has the embossed surface. For example, the embossed surface has the pattern of a logo. In case that the stamping surface is the smooth surface, the stamped color ink layer or the stamped UV-curable resin layer has the smooth surface. That is, the use of the stamping process can form the high gloss surface and the logo on the fingerprint identification module. In addition, the method of manufacturing the fingerprint identification module is time-saving.

From the above descriptions, the use of the stamping process forms the high gloss surfaces on the color ink layer and the UV-curable resin layer. Consequently, the fingerprint identification module has a mirror effect and is aesthetically pleasing. Moreover, a logo can be stamped on the high gloss surface through the stamping process. Since the thicknesses of the color ink layer and the UV-curable resin layer of the fingerprint identification module can be well controlled through the stamping process, the fingerprint identification module has enhanced identification accuracy.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:

1. A method for manufacturing a fingerprint identification module, the method comprising steps of:
   (a) providing a fingerprint sensor comprising a substrate, a sensing chip and a package layer, wherein the sensing chip is disposed on the substrate, and the sensing chip is encapsulated by the package layer;
   (b) coating an ink material on the package layer, so that a color ink layer is formed on the package layer;
   (c) using a stamping tool to stamp the color ink layer, so that a top surface of the color ink layer becomes a first high gloss surface; and (d) allowing the color ink layer to be heated through baking or irradiated with UV light, so that the color ink layer is hardened; wherein after the step (d), the method further comprises steps of:

(e) coating a UV-curable resin material on the color ink layer, so that a UV-curable resin layer is formed on the color ink layer;

(f) using the stamping tool to stamp the UV-curable resin layer, so that a top surface of the UV-curable resin layer becomes a second high gloss surface; and (g) allowing the UV-curable resin layer to be irradiated with UV light, so that the UV-curable resin layer is hardened.

2. The method according to claim 1, wherein after the step (d), the method further comprises a step (d') of forming an anti-fingerprint coating on the first high gloss surface of the color ink layer.

3. The method according to claim 1, wherein after the step (g), the method further comprises a step (g') of forming an anti-fingerprint coating on the second high gloss surface of the UV-curable resin layer.

4. The method according to claim 3, wherein a thickness of the fingerprint sensor is in a range between 10 and 30 micrometers, a thickness of the UV-curable resin layer is in a range between 10 and 15 micrometers, and a thickness of the anti-fingerprint coating is in a range between 1 and 3 micrometers.

5. The method according to claim 1, wherein the stamping tool used in the step (c) has a stamping surface, wherein the stamping surface is a smooth surface, an embossed surface, or a composite surface with a combination of the smooth surface and the embossed surface, wherein while the top surface of the color ink layer is stamped by the stamping tool, the top surface of the color ink layer is shaped by the stamping surface of the stamping tool.

6. The method according to claim 1, wherein the stamping tool used in the step (f) has a stamping surface, wherein the stamping surface is a smooth surface, an embossed surface, or a composite surface with a combination of the smooth surface and the embossed surface, wherein while the top surface of the UV-curable resin layer is stamped by the stamping tool, the top surface of the UV-curable resin layer is shaped by the stamping surface of the stamping tool.

7. The method according to claim 1, wherein the ink material is a light-cured ink material, a heat-cured ink material, or a mixed ink material with the light-cured ink material and the heat-cured ink material.

8. The method according to claim 1, wherein the stamping tool is a platen roller or a platen plate.

9. A fingerprint identification module, comprising:
a fingerprint sensor comprising a substrate, a sensing chip and a package layer, wherein the sensing chip is disposed on the substrate, and the sensing chip is encapsulated by the package layer; and
a color ink layer formed on the package layer, wherein after the color ink layer is stamped, the color ink layer has a first high gloss surface; wherein the fingerprint identification module further comprises:
a UV-curable resin layer, and the UV-curable resin layer is formed on the color ink layer, wherein after the UV-curable resin layer is stamped, the UV-curable resin layer has a second high gloss surface;
an anti-fingerprint coating, wherein the anti-fingerprint coating is formed on the second high gloss surface of the UV-curable resin layer; and wherein a thickness of the fingerprint sensor is in a range between 10 and 30 micrometers, a thickness of the UV-curable resin layer is in a range between 10 and 15 micrometers and a thickness of the anti-fingerprint coating is in a range between 1 and 3 micrometers.

10. The fingerprint identification module according to claim 9, further comprising an anti-fingerprint coating, wherein the anti-fingerprint coating is formed on the first high gloss surface of the color ink layer.

* * * * *